United States Patent [19]
Rolfson

[11] Patent Number: 5,804,336
[45] Date of Patent: Sep. 8, 1998

[54] METHOD OF FORMING OPAQUE BORDER ON SEMICONDUCTOR PHOTOMASK

[75] Inventor: J. Brett Rolfson, Boise, Id.

[73] Assignee: Micron Technology, Inc., Boise, Id.

[21] Appl. No.: 696,173

[22] Filed: Aug. 13, 1996

[51] Int. Cl.⁶ ........................................... G03F 9/00
[52] U.S. Cl. .................. 430/5; 430/315; 205/183
[58] Field of Search ...................... 430/5, 311, 313, 430/314, 315; 205/122, 183

[56] References Cited

U.S. PATENT DOCUMENTS

4,451,544  5/1984  Kawabuchi ................... 430/5
5,578,184  11/1996  Imataki et al. ................ 205/122

*Primary Examiner*—S. Rosasco
*Attorney, Agent, or Firm*—Fletcher, Yoder & Edwards

[57] ABSTRACT

The present invention provides a method of fabricating photomasks having a border region and a pattern region, which may be electrically isolated. The border region may include a nontransparent region, such as an opaque chrome layer. The pattern region may include a substantially nontransparent region, such as a leaky chrome layer. The methods of the present invention include placing the photomask in an electrochemical cell and electrically connecting a portion of the photomask to an electrode, and applying a potential, thereby electrochemically transferring a layer between the electrochemical cell and the photomask.

43 Claims, 7 Drawing Sheets

METHOD OF FORMING OPAQUE BORDER ON SEMICONDUCTOR PHOTOMASK

FIELD OF THE INVENTION

The present invention relates to a photomask used in a photolithography process and, more specifically, to a method of fabricating a photomask.

BACKGROUND OF THE INVENTION

A photomask may be used to transfer a pattern onto a semiconductor wafer. The pattern which is to be transferred onto the wafer may be formed on a material, such as glass or quartz, which is substantially transparent. The material of the photomask may also include thin films of metal or other nontransparent material that prevent light from passing through selected portions of the photomask. In typical photomasks, the nontransparent material is opaque chrome.

Due to limitations imposed by the wavelength of light used to transfer the pattern, resolution degrades at the edges of the patterns of the photomask. Phase-shifting photomasks increase the resolution of patterns by creating phase-shifting regions in the transparent areas of a photomask. Standard phase-shift photomasks generally are formed either by (1) depositing transparent films of appropriate thickness and patterning them over the desired transparent areas using a second level lithography and etch technique, or (2) etching vertical trenches in the substrate. In both of these instances, the edges between the phase-shifted and unshifted regions generally result in a transition between high and low refractive index regions.

The characteristics of the photomask described above generally relate to a hard or strong phase-shifter type. This type of photomask is known as an "alternating aperture" or "Levenson-type" phase-shift mask. These types of masks include transmission areas (light transmitted through the substantially transparent areas) on either side of a patterned opaque feature. One of these transmission areas transmits light 180° out of phase from the other transmission areas, and both sides transmit approximately 100% of the incident radiation. Light diffracted underneath the opaque regions from these phase-shifted regions thus cancels each other, thereby creating a more intense null or "dark area."

Due to the difficulty of fabricating this type of photomask, another type of phase-shifting mask has emerged. This type of phase-shifting mask is known as an "attenuated" or "half-tone" phase-shift mask. In this type of mask, the transparent regions transmit approximately 100% of the incident radiation, similar to the strong phase-shifting mask. However, the transparent areas are in-phase. The "phase-shifting" feature of an attenuated phase-shift mask is due to the fact that the opaque regions of the hard shifters are replaced with areas that are slightly transmissive, and act to shift light transmitted by 180°. Transmission of this incident radiation is typically in the 6–9% range for these masks.

Attenuated phase-shift masks are easier to pattern and fabricate than strong phase-shifter photomasks. Depending on the process used, an attenuating phase-shift mask may only require a single maskwriting step (similar to a binary mask). Other processes may be used which require two maskwriting steps in order to create an opaque border region. At the present time, single-write processes, without the opaque border, have not been successful in photolithography steppers which use longer wavelengths for alignment or reticle identification, due to the material constraints of the pattern material.

One method of forming an attenuated phase-shifting photomask is to utilize a material which is substantially nontransparent as a phase-shifting layer. Leaky chrome is often used for this purpose to define the device patterns, rather than the standard opaque chrome used in non-phase-shifting masks or in strong phase-shift masks. Leaky chrome may be, for example, a chrome/oxy/nitride, or a form of $MoSi_2$ or other such material. The exact composition of the first layer may vary. The terms "substantially nontransparent" or "predominantly nontransparent" generally mean that the layer may allow between 4 to 12% of incident light to pass through the mask, and more typically between 6 to 9% at the exposure wavelength. It is to be understood that although only a small percentage of light may be transmitted at the exposure wavelength, the material may be transparent at longer wavelengths. A photomask using this material effectively shifts light 180° and increases the resolution of patterns created by the photomask.

Figure 4:
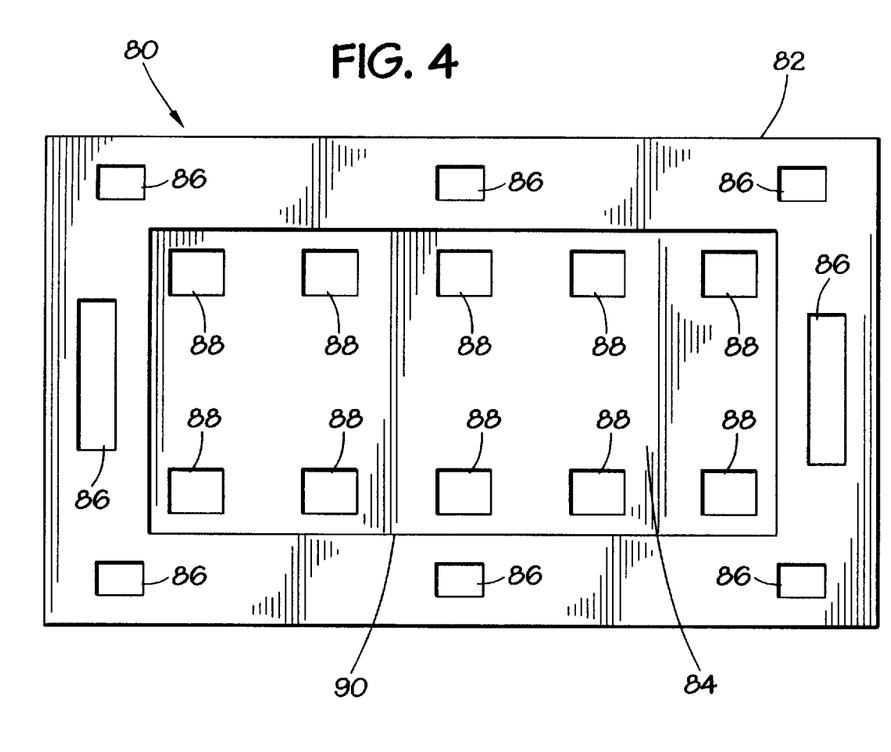
FIG. 4 is a top view diagram showing a photomask having a border region and a pattern region.

Masks are usually fabricated to include a border region and a pattern, sometimes referred to as a device region. The device region is the region in which the patterns represent the desired circuitry. The border region is the region in which the patterns may be used for alignment structures, bar codes, and other purposes. It may also be desired to have an opaque layer on the border region of a mask to aid in detection of border structures, such as alignment structures, bar codes, and mask identifiers. FIG. 4 shows a top view of a photomask. As shown in FIG. 4, the photomask is separated into a border region 82 and a pattern region 84. A plurality of patterns 86 may be located in the border region 82, and a plurality of patterns 88 may be located in the pattern region 84.

Present semiconductor wafer fabrication processes may utilize photolithography steppers. These steppers may use, for example, a 714 nm laser to read a bar code printed on a border region of a mask or the steppers may use, for example, a 633 nm helium-neon laser to read alignment structures. If the border includes only a leaky chrome layer and not an opaque chrome layer, the stepper may not adequately read the bar code or alignment structure. Thus, opaque border regions are desirable. Opaque border regions are further desirable even if the photolithography process includes the use of a blade. The blade may be used to block the border regions of a photomask during patterning. Such blading prevents unwanted exposure of border regions. Since the focal point of the bladed area is not on the same plane as the reticle, it is possible to expose border areas of the mask, which may create errors in processing. Therefore, it is also desirable to utilize an opaque chrome layer to block the border regions rather than merely rely on the use of blades.

Several methods of fabricating a photomask having an opaque layer on the border of the mask are known in the art. One process requires two mask-writing steps. First, a primary mask pattern is written and etched to the underlying substrate of the mask blank, the photoresist is stripped, and the mask blank is re-coated. Second, an opaque layer is written onto the border of the mask.

The second method involves a single mask-writing step with a series of "sub-resolution" patterns written around the border of the device region of a mask or reticle. This method dramatically increases write time and therefore decreases throughput on a mask-writing tool. In certain methods, such subresolution patterns may take as long as 12 hours to write. Further, the subresolution pattern is only applicable at the exposure wavelength and has little or no impact on commonly-used barcode and alignment wavelengths.

The present invention is directed to, among other things, addressing one or more of the problems set forth above.

SUMMARY OF THE INVENTION

In accordance with one aspect of the present invention, there is provided a method of fabricating a photomask which may include the following steps: forming a patterned photoresist layer located over a first layer that is located over a substrate having a border region and a pattern region, thereby creating openings exposing portions of the first layer; etching the openings of the first layer, thereby exposing portions of the substrate in both the border region and the pattern region; and placing the substrate in an electrochemical cell and applying an electrical potential to a plurality of electrodes within the cell, thereby electrochemically transferring a second layer between the solution and the substrate.

BRIEF DESCRIPTION OF THE DRAWINGS

A better appreciation of the present invention may be gained from a study of the specific disclosed embodiments and of the drawings in which.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims.

DETAILED DESCRIPTION OF PREFERRED EMBODIMENTS

The present invention utilizes an electroplating or an electrodeplating process to create a photomask. The mask created by this process may be an alternating aperture, half-tone or attenuated phase-shift mask. Alternatively, the present invention also may be utilized for creating non-phase-shifting photomasks.

Figure 1A:
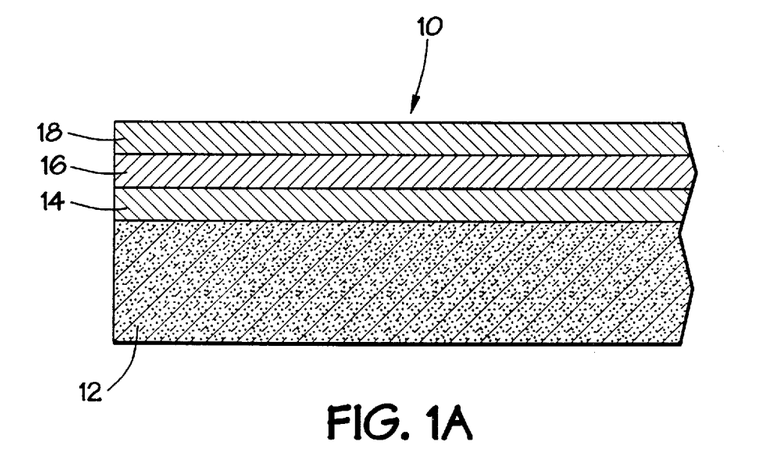
FIG. 1A is a cross-sectional diagram showing a photomask substrate over which is deposited layers of "leaky chrome," opaque chrome, and photoresist.
Figure 1B:
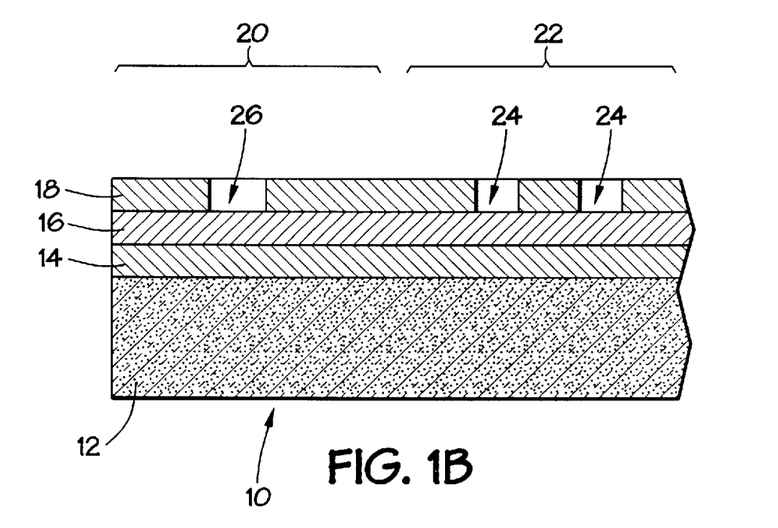
FIG. 1B is a cross-sectional diagram showing a formation of patterned photoresist atop the substrate of FIG. 1A.

FIGS. 1A–1E show a cross-sectional representation of a prior art method of fabricating a phase-shifting photomask. FIG. 1A shows a mask blank 10, which includes a quartz substrate 12 over which is located a leaky chrome layer 14, an opaque chrome layer 16, and a layer of photoresist 18. FIG. 1B shows the border region 20 and the pattern region 22 of the mask blank 10. The device patterns which are to be transferred to a wafer (not shown) are contained within the pattern or device region 22. In FIG. 1B, a pattern is defined into the photoresist layer 18, creating patterned openings 24 in the pattern region 22 and an opening 26 in the border region 20. These openings thereby expose the opaque chrome layer 16.

Figure 1C:
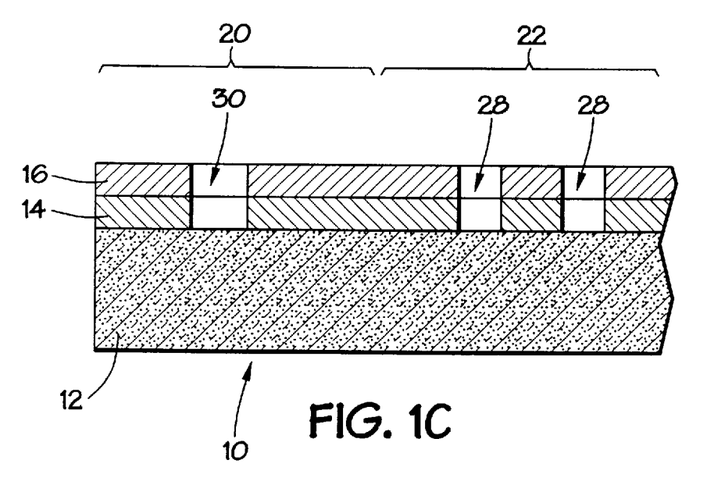
FIG. 1C is a cross-sectional diagram showing a formation of openings within the opaque and leaky layers of FIG. 1A.
Figure 1D:
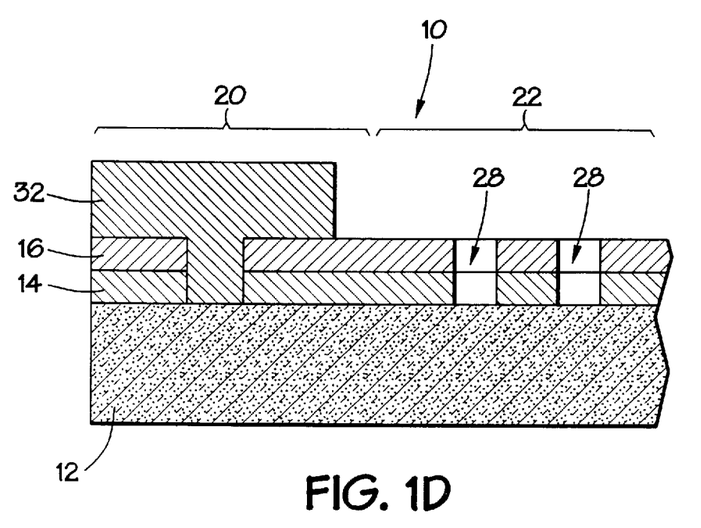
FIG. 1D is a cross-sectional diagram showing a photoresist layer selectively retained over a border region of the substrate of FIG. 1A.
Figure 1E:
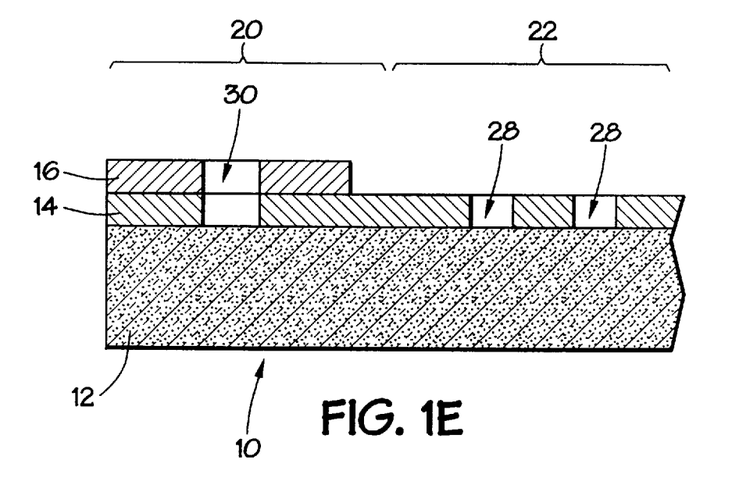
FIG. 1E is a cross-sectional diagram showing a resulting photomask fabricated from a prior art process.

The opaque layer 16 and the phase-shifting layer 14 are then etched to create patterned openings 28 in the pattern region 22 and an opening 30 in the border region 20. As shown in FIG. 1C, this etching exposes the quartz layer 12. The mask blank 10 is then recoated with a photoresist layer 32. The photoresist layer 32 is then exposed with a mask-writing step to expose the opaque chrome layer 16 of the pattern region 22, as shown in FIG. 1D. The opaque layer 16 is then selectively removed, leaving only the phase-shifting layer 14 in the pattern region 22. The opaque layer 16 remains, however, in the border region 20. The photoresist layer 32 may then be removed, as shown in FIG. 1E. These steps create a photomask having a border region with an opaque layer and a pattern region which does not have an opaque layer. Problems with this method include the following. First, it is not possible to determine the presence of defects in the phase-shifting layer 14 once the opaque layer 16 has been deposited, thus reducing yield. Second, additional defects may be created by application and patterning of the second photoresist layer 32. Further, this double writing method reduces throughput.

Another method of fabricating mask blanks is a single write method, in which a subresolution pattern is written around the border of the pattern region. This method of fabricating a mask blank has several problems associated with it. Mask blanks fabricated by this method tend to exhibit higher transmission than ordinary chrome blanks in the border region, as there is no deposited layer of opaque chrome. Further, the effect of these mask blanks on alignment repeatability and stability has not been proven in volume production. Also, as exposure wavelength decreases to deep ultra violet (DuV) (248 or 193 nm), these blanks may not exhibit sufficient opacity desired in the border regions at 633 nm and 714 nm. Further, this method greatly reduces throughput, as writing the subresolution pattern is time consuming.

Figure 2A:
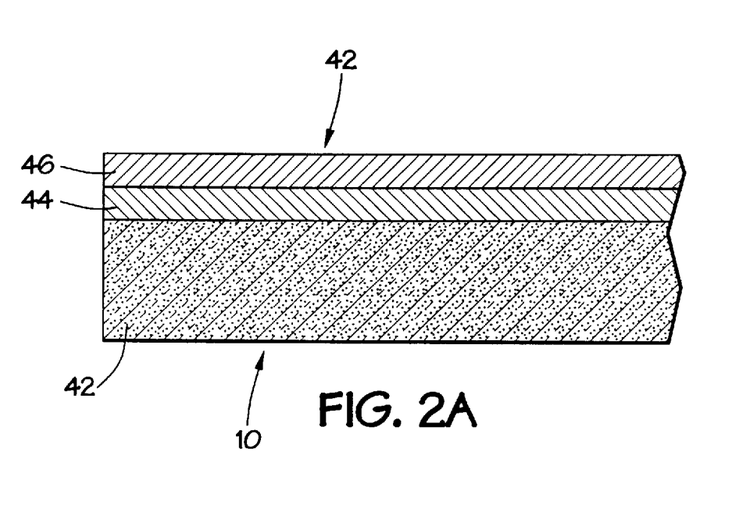
FIG. 2A is a cross-sectional diagram showing a substrate covered by a phase-shifting layer and a photoresist layer.

FIGS. 2A–2E show a mask blank 40, and a method of fabricating a mask blank having an opaque layer on the border region according to the present invention. It is to be noted that this layer only needs to be sufficiently opaque to an incident wavelength, for example, the exposure wavelength, the barcode reader, or alignment wavelength, in order for those functions to perform properly. However, it need not be entirely opaque to all incident illumination. A substrate 42, which may be quartz, glass, or any other substantially transparent material, is used as the base of mask blank 40. A first layer 44, which may be a phase-shifting layer, is placed over the substrate 42, as shown in FIG. 2A. This first layer 44 may be comprised of a light-blocking material that is substantially nontransparent, such as a type of chrome or $MoSi_2$. This first layer 44 may be made of a "leaky chrome" material. The first layer 44 may be deposited by known techniques, such as chemical vapor deposition (CVD), radio frequency (RF) sputtering, or the like. This method does not require an opaque chrome layer to be coated over the leaky chrome layer prior to patterning.

Figure 2B:
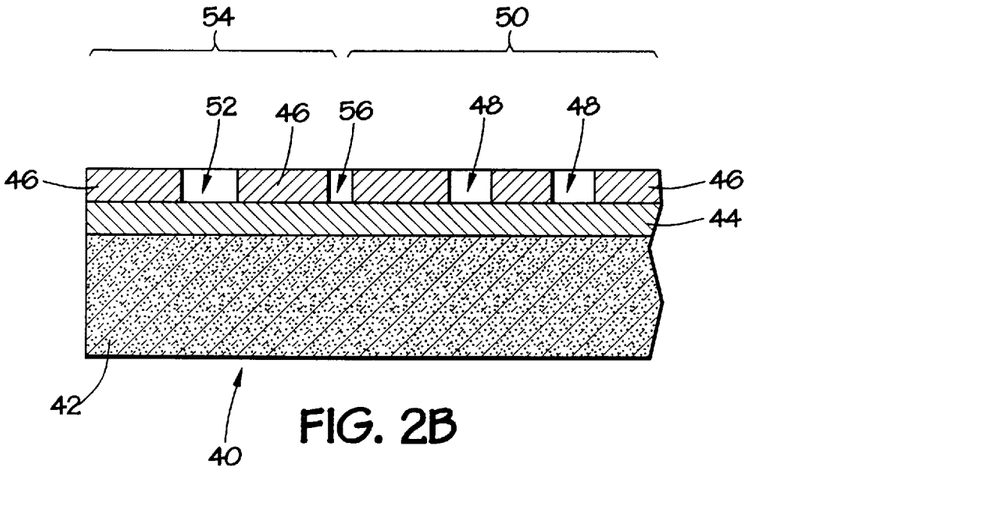
FIG. 2B is a cross-sectional diagram showing a patterned photoresist layer, exposing portions of the phase-shifting layer.

Over the first layer 44, a layer 46 of photoresist may be placed, as shown in FIG. 2A. The photoresist layer 46 may be comprised of any commercially available photoresist, such as OCG895i. The photoresist layer 46 may be patterned using standard lithography techniques to form openings 48 in a pattern region 50 and openings 52 in a border region 54 of mask blank 40, as shown in FIG. 2B. It is to be understood that the mask blank 40 may include one border region 54 disposed around the entire perimeter of the mask blank 40, surrounding pattern region 50. The pattern region 50 may include a plurality of individual pattern regions. In alternate embodiments, it is contemplated that there may be a plurality of pattern regions 50, each individually separated by a plurality of border regions 54. The openings in the pattern region 50 and border region 54 thereby expose portions of the first layer 44. The pattern may be designed to include an opening 56 at the junction of the border region 54 and pattern region 50. The width of opening 56 may be selected so as to adequately electrically isolate the border region 54 from the pattern region 50. If the width of opening 56 is not sufficient to do so, it may be possible to separate border region 54 from pattern region 50 by a plurality of openings 56 of smaller widths, which in combination, sufficiently electrically isolates the two regions.

Figure 2C:
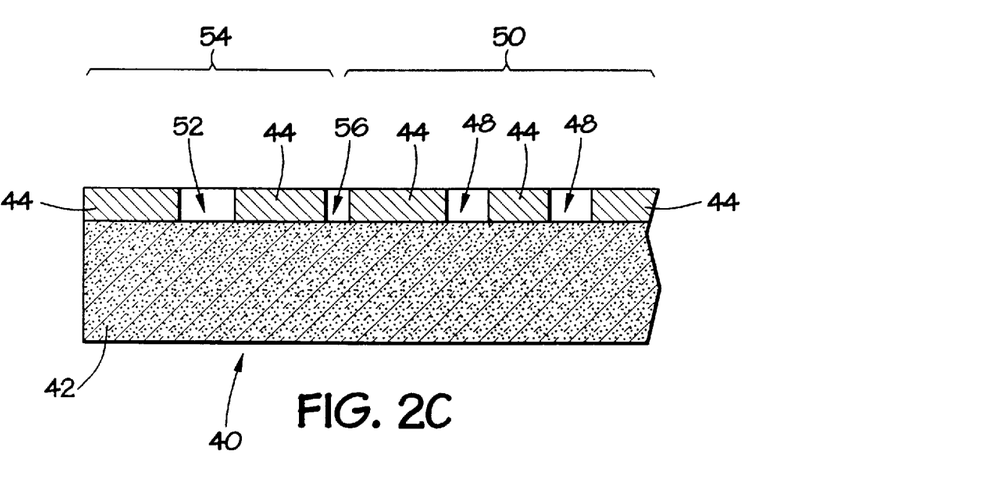
FIG. 2C is a cross-sectional diagram showing the separation of the substrate into a border region and a pattern region.
Figure 2D:
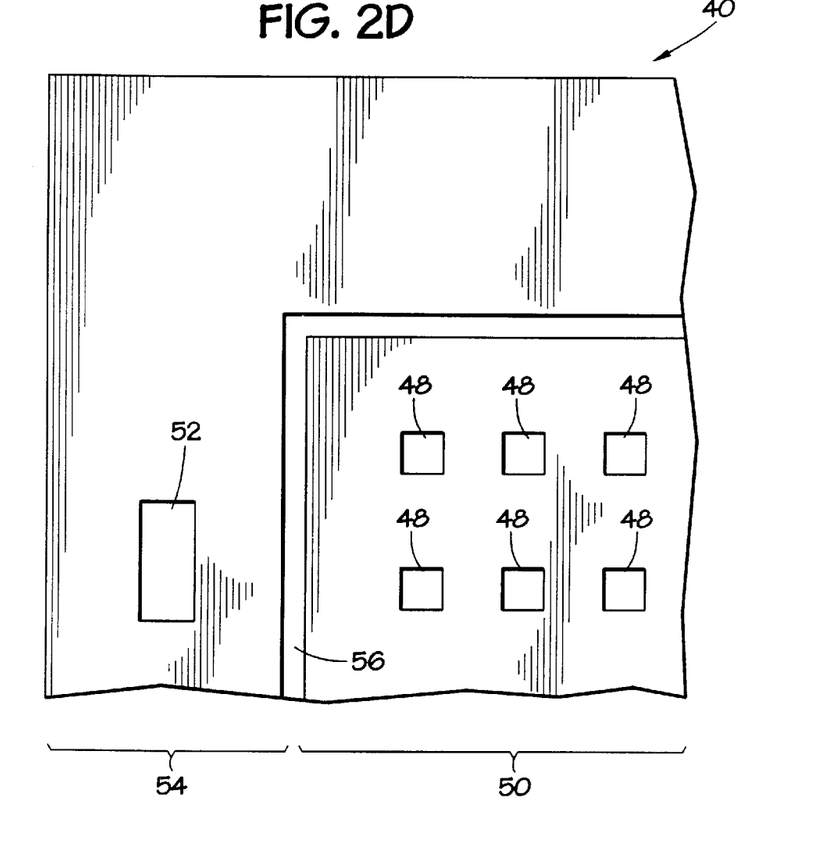
FIG. 2D is a top view diagram showing the electrical isolation of the border region from the pattern region.

Then, a process, such as a wet or dry etching process, may be used to etch openings into the first layer 44. This etch process may use, for example, Cyantek CR-14, which primarily consists of ceric ammonium nitrate and acetic acid, or any other etchant to etch the openings in the first layer 44. Other etching processes, such as a dry plasma etch, which may use a chlorine-based etchant, may also be used to etch these openings. The etching creates patterned openings 48 in the pattern region 50, opening 56 at the junction between the border region 54 and the pattern region 50, and opening 52 in the border region 54, as shown in FIGS. 2C–2D. These openings expose the substrate layer 42. Opening 56 may be designed to surround the pattern region 50 and electrically isolate the pattern region 50 from the border region 54. It is to be understood that these openings are exemplary, and a particular mask will have as many openings as a particular pattern requires. Opening 52 may be, for example, a portion of any number of structures, such as an alignment structure, a bar code, a device or layer number identifier, a manufacturer identifier, a date identifier, etc.

An electrochemical process may be used to coat the border region 54 with an opaque material. To perform the electrochemical process, it is necessary to provide an electrochemical cell, which may include a plurality of electrodes connected to a DC power source, and a solution. The solution may include, for example, a mixture of chromic acid, sulfuric acid, and water. A portion of the mask blank 40 may be electrically connected to an electrode, which may be either an anode or cathode of an electrochemical cell. In an embodiment in which it is desired to electroplate a layer onto border region 54, the border region 54 may be electrically connected to the cathode, or negative electrode of the power source. In an embodiment in which it is desired to remove a layer from the border region 54, the pattern region 50 may be electrically connected to the cathode, or negative electrode of the power source, and the electrochemical cell may include a deplating solution.

Figure 2E:
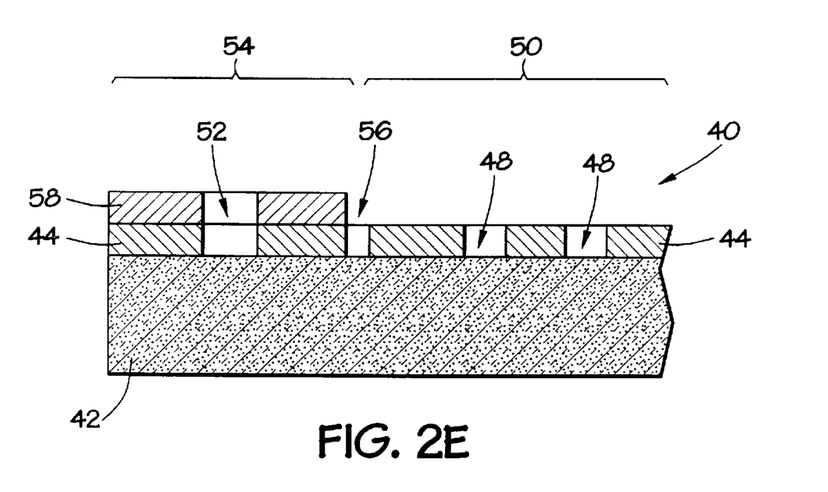
FIG. 2E is a cross-sectional diagram showing a photomask fabricated according to the present invention.

After placing the mask of FIG. 2C in the electrochemical cell, a potential is applied to the system. This potential may be of sufficient magnitude so as to cause the desired electrochemical reaction to occur. As shown in FIG. 2E, the border region has been electroplated with layer 58 as a result of connecting the cathode of the electrochemical cell to the border region of layer 44. The photomask 40 may remain in the solution for an amount of time sufficient to provide the desired layer. In embodiments in which a layer is electrodeposited, this time thereby deposits an electrodeposited opaque chrome layer 58 over the phase-shifting layer 44. However, as the pattern region 50 is electrically isolated from the border region 54, this electrodeposited second layer 58 is deposited only on the border region 54.

Figure 3A:
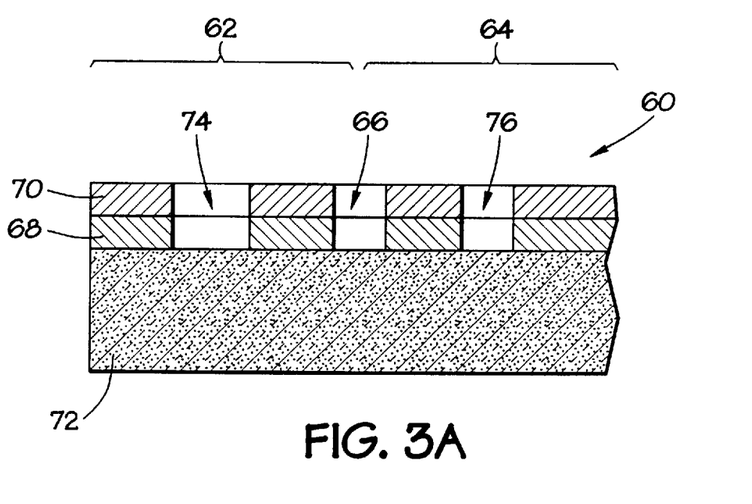
FIG. 3A is a cross-sectional diagram showing a patterned photomask, having a border region and pattern region covered with a leaky chrome layer and an opaque chrome layer.
Figure 3B:
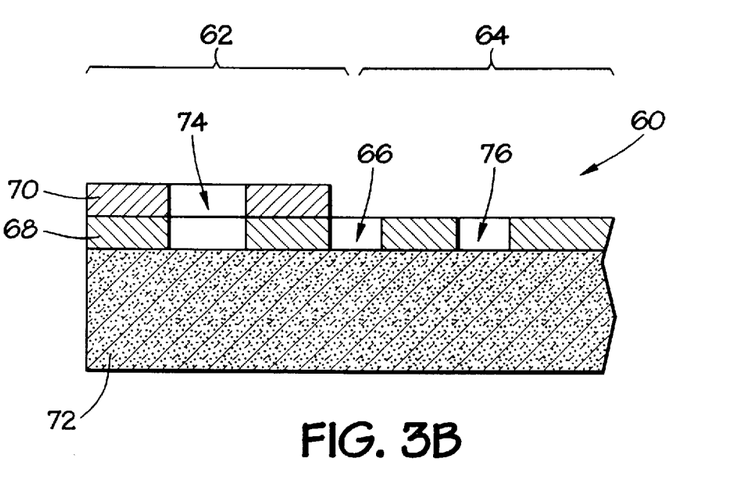
FIG. 3B is a cross-sectional diagram showing a photomask fabricated according to the present invention.

Another embodiment of the present invention may use an electrochemical process to remove desired portions of a layer on a photomask substrate. This process may be known as electroremoval. FIGS. 3A and 3B illustrate this alternative embodiment. FIG. 3A shows a mask blank 60 created on a substrate 72 having a border region 62 and pattern region 64. Both border region 62 and pattern region 64 are covered with a first layer 68 which may be a phase-shifting layer, such as leaky chrome. Both regions are also covered with a second layer 70, which may be a non-transparent layer, such as, for example, opaque chrome. The mask blank 60 may be processed as discussed above to create opening 74 in the border region 62, opening 76 in the pattern region 64, and opening 66 separating the border region 62 from the pattern region 64. The mask blank 60 is placed in a electrochemical cell, as discussed above. In this embodiment, the electrochemical cell may include a solution of sulfuric acid or hydrochloric acid. The portion of the second layer 70 desired to remain may be electrically connected to the cathode, or negative electrode of the electrochemical cell (not shown). For example, it may be desired to remove the second layer 70 from the pattern region 64. In such a case, the cathode may be electrically connected to the border region 62. In this embodiment, application of a potential for a given period of time prevents the removal of the second layer 70 within the electrically isolated border region 62. However, the second layer 70 of the pattern region 64 is dissolved into the solution, thereby producing in the mask of FIG. 3B.

Certain border features such as alignment keys or the like may be isolated from the rest of the border region. Therefore, the isolated features may be electrically connected to the border region so that the features may be electrodeposited. Small connections, such as a bridge link, i.e. a metal bridge link, may suffice to connect these isolated features electrically. The mask blank 60 is then placed in the electrochemical cell. The electrochemical process may thereby deposit or remove a layer of metal on or from the mask blank 60. In an exemplary embodiment, the metal may be chrome, such as opaque chrome. Other metals such as nickel and copper or any alloy-based mixtures may also be used.

FIG. 4 is a plan view of a photomask according to the present invention. Photomask 80 comprises, for example, a border region 82 and a pattern region 84. The border region 82 may be separated from the pattern region 84 by an electrical isolation 90. A plurality of patterns 86 may be created within the border region 82. These patterns 86 may be, for example, for reticle identification, alignment, or other such purposes. A plurality of patterns 88 may be created within the pattern region 84. These patterns 88 may be, for example, active circuit devices.

Therefore, a photomask is formed in which the pattern or device regions have layers of different opacity than the border region of the mask. Further, the use of an electrochemical process as described herein may provide performance and/or manufacturing throughput benefits. Thus a semiconductor mask is formed in part by electrochemical processes. In an exemplary embodiment, a border region of the photomask may include a layer deposited by electrodeposition. However, the principles of the present invention may be applied to electrodeposition of other regions of the photomask. For example, it may be possible to electroplate the pattern regions, while not electroplating the border region.

What is claimed is:

1. A method of fabricating a photomask, comprising the steps of:
    forming a first pattern directly on a photomask substrate;
    forming a second pattern directly on a photomask substrate, said first pattern being electrically isolated from said second pattern; and
    electrochemically forming a layer on a selected one of said first pattern and said second pattern.

2. A method as claimed in claim 1 wherein said layer is deposited on said selected one of said first pattern and said second pattern by electrodeposition.

3. A method as claimed in claim 2 wherein said layer is deposited on a border region.

4. A method as claimed in claim 1 wherein said layer is removed from said selected one of said first pattern and said second pattern by an electrochemical process.

5. A method of fabricating a photomask, comprising the steps of:
    depositing a first layer over a substrate, said substrate having a border region and a pattern region;
    forming a patterned photoresist layer located over said first layer, thereby creating openings exposing portions of said first layer;
    etching said exposed portions of said first layer, thereby exposing portions of said substrate in both the border region and the pattern region; and
    placing said substrate in an electrochemical cell and applying an electrical potential to a plurality of electrodes within said cell, thereby electrochemically forming a second layer on a selected one of said border region and said pattern region.

6. A method as claimed in claim 5 wherein said second layer is deposited on said selected one of said border region and said pattern region by electrodeposition.

7. A method as claimed in claim 6 wherein said second layer is deposited on said border region.

8. A method as claimed in claim 7 wherein said step of etching comprises the step of electrically isolating said pattern region from said border region.

9. A method as claimed in claim 7 wherein said first layer comprises a phase-shifting layer.

10. A method as claimed in claim 7 wherein said first layer is a metallic material.

11. A method as claimed in claim 10 wherein said metallic material is chrome.

12. A method as claimed in claim 11 wherein said chrome is leaky chrome.

13. A method as claimed in claim 6 wherein said substrate is comprised of quartz.

14. A method as claimed in claim 5 wherein said second layer is removed from said selected one of said border region and said pattern region by an electrochemical process.

15. A method as claimed in claim 5 wherein one of said plurality of electrodes is electrically connected to a portion of said first layer.

16. A method as claimed in claim 5 wherein said electrochemical cell comprises a solution of chromic acid, sulfuric acid, and water.

17. A method as claimed in claim 7 wherein said second layer is opaque chrome.

18. A method as claimed in claim 7 wherein said substrate is substantially transparent.

19. A method as claimed in claim 7 wherein said first layer is substantially nontransparent.

20. A method as claimed in claim 7 wherein said second layer is substantially nontransparent.

21. A method as claimed in claim 20 wherein said substantially nontransparent layer is opaque chrome.

22. A method as claimed in claim 7 wherein said photomask is for use in fabricating semiconductor wafers.

23. A method of fabricating a semiconductor photomask, comprising the step of:
    electrochemically forming a layer on a substrate, said substrate having a border region and a pattern region, said border region and said pattern region being electrically isolated from each other, said layer being electrochemically formed on a selected one of said border region and said pattern region.

24. A method as claimed in claim 23, wherein said step of electrochemically forming comprises placing said substrate in an electrochemical cell and applying an electrical potential to a plurality of electrodes within said cell.

25. A method as claimed in claim 23 wherein said layer is electrochemically deposited on said substrate.

26. A method as claimed in claim 23 wherein said layer is electrochemically removed from said substrate.

27. A method as claimed in claim 23 wherein said substrate is comprised of quartz.

28. A method as claimed in claim 23 wherein said layer is comprised of opaque chrome.

29. A method as claimed in claim 23 further comprising the step of depositing a first layer above said substrate prior to said step of electrochemically forming said layer.

30. A method as claimed in claim 29 wherein said first layer comprises a metallic material.

31. A method as claimed in claim 30 wherein said metallic material comprises leaky chrome.

32. A method as claimed in claim 29 wherein said first layer is a phase-shifting layer.

33. A method as claimed in claim 23 wherein said layer comprises a metallic material.

34. A photomask used in fabrication of semiconductor wafers, comprising:
    a transparent substrate;
    a layer of phase-shifting material formed on said substrate; and
    a layer of opaque material electrochemical formed on said layer of phase-shifting material.

35. An apparatus as claimed in claim 34 wherein said layer of opaque material is located within a border region of said substrate.

36. An apparatus as claimed in claim 34 wherein said substrate includes a border region electrically isolated from a pattern region.

37. A phase-shifting photomask comprising:
    a substrate having a border region and a pattern region;
    a first layer located over said substrate in both said border region and said pattern region; and
    a second layer located over said first layer in said border region, said second layer formed by electrodeposition.

38. A phase-shifting photomask as claimed in claim 37 wherein said second layer is opaque chrome.

39. A phase-shifting photomask as claimed in claim 37 wherein said border region is electrically isolated from said pattern region.

40. A method of fabricating a photomask; comprising the steps of:

depositing a layer of phase-shifting material onto a transparent substrate, said substrate having a border region and a pattern region;

forming a patterned photoresist layer on said layer of phase-shifting material; said patterned photoresist layer having openings exposing portions of said layer of phase-shifting material;

removing said exposed portions of said layer of phase-shifting material to create a first pattern on said border region and a second pattern on said pattern region, said first pattern and said second pattern being electrically isolated from one another; and electrochemically forming a layer of metallic material on a selected one of said first pattern and said second pattern.

41. A method as claimed in claim 40 wherein said metallic material is opaque chrome.

42. A method as claimed in claim 40 wherein said step of electrochemically forming comprises the step of electrodepositing said layer of metallic material.

43. A method as claimed in claim 40 wherein said step of electrochemically forming comprises the step of electroremoving said layer of metallic material.

* * * * *